United States Patent [19]
Perce et al.
[11] 3,874,444
[45] Apr. 1, 1975

[54] DUO-BAFFLE AIR SEPARATOR APPARATUS

[75] Inventors: Salvador Perce, Bellwood; Anthony Traina, Villa Park, both of Ill.

[73] Assignee: GTE Automatic Electric Laboratories Incorporated, Northlake, Ill.

[22] Filed: Dec. 3, 1973

[21] Appl. No.: 421,452

[52] U.S. Cl. 165/47, 165/80
[51] Int. Cl. F24h 3/00
[58] Field of Search 165/47, 80, 110

[56] References Cited

UNITED STATES PATENTS 1,874,679 8/1932 Willoughby 165/110

*Primary Examiner*—Charles Sukalo
*Attorney, Agent, or Firm*—James V. Lapacek; Robert F. Van Epps

[57] ABSTRACT

A duo-baffle air separator apparatus is provided between vertical sections of a frame of heat dissipating equipment to improve thermal conditions. A first and a second baffle are provided that are inclined relative to the horizontal from the front to the rear of the equipment to thermally isolate sections of the equipment and to separate streams of rising heated air from the immediately lower section to eliminate air turbulence and mixing effects between sections.

5 Claims, 4 Drawing Figures

DUO-BAFFLE AIR SEPARATOR APPARATUS

BACKGROUND OF THE INVENTION

1. Field of the Invention

The present invention relates generally to the field of heat transfer and more particularly to an air separator apparatus for frames or racks of heat dissipating equipment.

2. Description of the Prior Art

In modern electronic systems, rack mounted electronics typically dissipate large amounts of heat into the relatively confined volume of the systems outer package. To prolong the lifetime of electronic components and avoid exceeding thermal limits of printed circuit card components mounted within the frame, it is imperative that the heat dissipated by the components be removed from the immediate system environment as efficiently as possible. A variety of electronic system cooling schemes have been devised using both forced and free convection principles. Typical of free convection arrangements are those described in U.S. Pat. No. 3,280,377 which issued to A. E. Harris et al on Oct. 18, 1966 and German Pat. No. 1,263,119 wherein electrical apparatus is mounted on racks which are inclined. Vertically adjacent racks form air flow passages through which cooling air is passed.

In many modern electronic systems the wiring card files or equipment racks are completely enclosed from the rear by solid printed wiring boards which serve as an electrical ground plane. The inflow of air is then limited to entry from the front of the frame and also from the bottom or base of the frame equipment. The complex air flow patterns including front replacement air and air rising from the lower portions of the equipment racks cause uneven air flow and blocking near the rear of the equipment with air turbulence effects created at the front portions of the equipment.

OBJECTS AND SUMMARY OF THE INVENTION

Accordingly it is a principle object of the present invention to provide a new and novel duo-baffle air separator apparatus for racks or frames of electrical apparatus that improves air flow and eliminates turbulence effects.

Another object is a duo-baffle air separator apparatus that separates the air streams formed by front replacement air and rising air from the base of the equipment and efficiently removes the separated air streams from the equipment.

These and other objectives of the present invention are efficiently achieved by providing a first baffle inclined from the front to rear of the equipment and a second baffle generally parallel to the first baffle and positioned below the first baffle. The second baffle is of shorter length from front to rear than the first baffle and extends to the rear of the equipment. Hot air rising by convection from the lower portions of the equipment and front replacement air form a front air stream and a rear air stream with the rear air stream being deflected by the second baffle and passed out the rear of the frame and the front air stream being deflected by the first upper baffle and passing out the rear of the frame between the first and second baffle spacing.

Other objects will appear from time to time in the ensuing specification, drawings and claims.

DESCRIPTION OF THE PREFERRED EMBODIMENT

Figure 1:
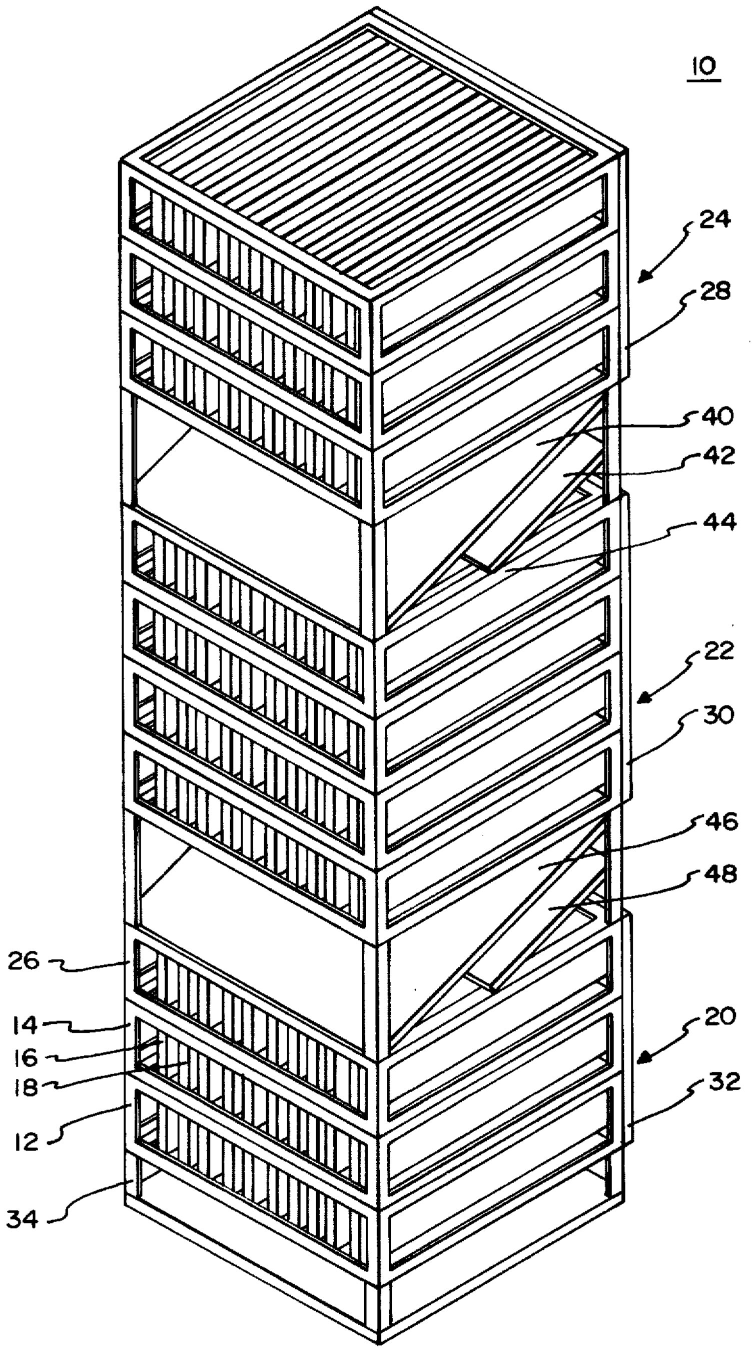
FIG. 1 is a perspective view of an equipment rack utilizing the duo-baffle air separator apparatus of the present invention.
Figure 2:
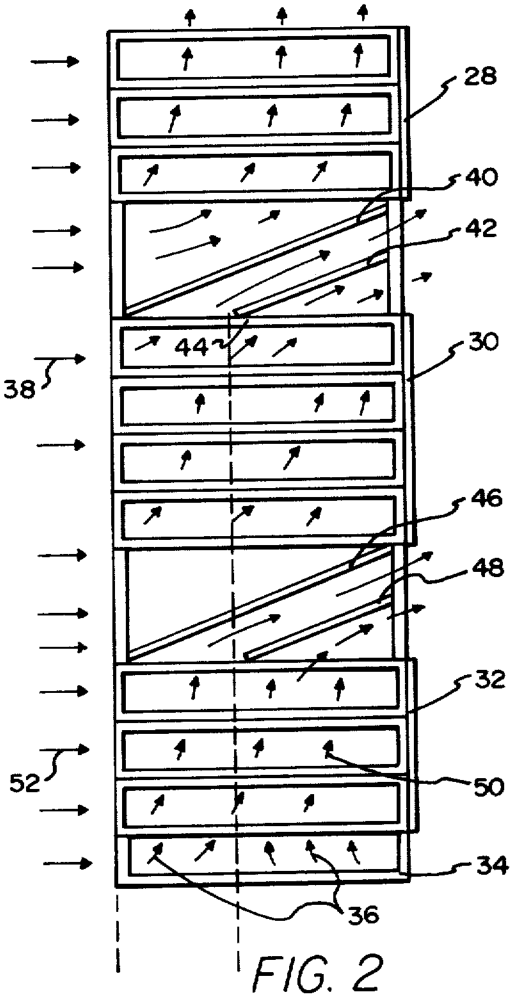
FIG. 2 is a side view of the apparatus of FIG. 1.
Figure 3:
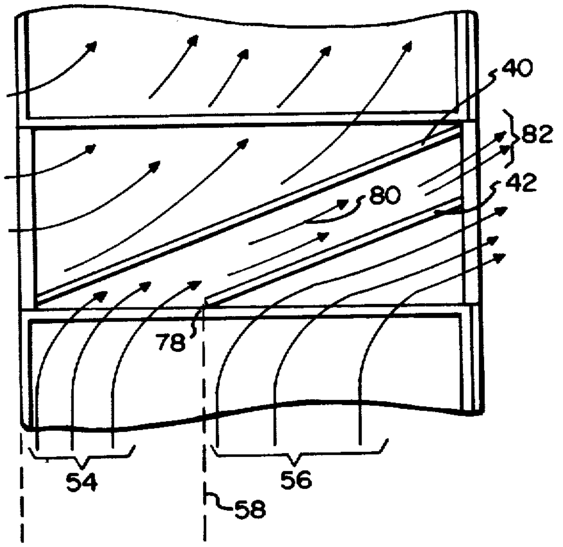
FIG. 3 is an enlarged partial view of the apparatus of FIG. 2 illustrating the air flow patterns of the present invention.

The duo-baffle air separator apparatus of the present invention illustrated in FIGS. 1, 2 and 3 is utilized within conventional equipment frames or racks 10 which includes a number of vertically stacked levels such as 12 and 14 of FIG. 1. The equipment rack 10 is generally of open construction with various support members with printed circuit cards such as 16 and 18 retained by an individual level 14. The equipment frame 10 may include any number of levels depending upon geometry, vertical space limitations and thermal considerations. Further to incorporate the duo-baffle air separator apparatus of the present invention the equipment rack levels are divided into sections such as a lower section 20, an intermediate section 22 and an upper section 24 with each of the sections including a number of levels such as levels 12, 14, and 26 of the lower section 20. The sections of the equipment rack 10 are spaced one section from the next to allow an open space between the sections. In a common application, the spacing between the various sections may be approximately the height of one level such as 12 or 14 with the spacing dimension being determined by the number of levels per section, the overall geometry of the equipment frame 10 and the thermal limitations involved.

It should be noted that the various levels such as 12, 14 and 26 of the equipment frame 10 are spaced one atop the other with little or no spacing between each level forming the equipment frame 10. While the front of the equipment frame 10 is of generally open construction as are the sides, the rear of each of the sections 20, 22 and 24 is closed off by ground planes 28, 30 and 32 which include the printed wiring connections, intercabling and support frames which are of thermally insulating construction such as plastics or other materials. The lowest level 34 of the lower section 20 has no printed circuit cards inserted and is of generally open construction to allow air to enter from all sides as indicated by the air flow arrow such as 36 in FIG. 2. Front replacement air also enters the equipment frame 10 as shown by the air flow arrow 38 in FIG. 2.

The duo-baffle air separator apparatus is positioned between vertical sections of the frame equipment 10 such as between the upper section 24 and the intermediate section 22 and also between the intermediate section 22 and the lower section 20. The duo-baffle air separator apparatus positioned between the sections 22 and 24 includes a first baffle element 40 and a second baffle element 42 that are each inclined relative to the horizontal from the front to the rear of the equipment 10 and provide thermal isolation between the sections of the equipment. The first baffle element 40 extends from the front of the equipment to the rear of the equipment effectively blocking and thermally isolating the intermediate section 22 from the upper section 24 of the equipment. The second baffle element 42 is positioned below and generally parallel to the first baffle element 40 and extends from the rear of the equipment and terminates at a point along the side of the equipment frame 44 at a substantial distance from the front of the equipment thereby only partially blocking air flow from the intermediate section 22 to the first baffle element 40. The baffles 40 and 42 may be generally planar in shape or may also be of arcuate cross section. Similarly a first baffle element 46 and a second baffle element 48 are provided between the intermediate section 22 and the lower section 20. It should be noted that while three vertical sections and two duo-baffle air separator apparatus are shown in the present embodiment, the equipment frame 10 might accomodate any number of vertical sections and include a duo-baffle air separator apparatus between each of the adjoining sections. Further, the air separator apparatus may be interspersed in the array of stacked vertical levels at any desired frequency. The baffle elements 40, 42, 46 and 48 may be formed of any convenient substantially air impervious material and further it is preferred in the practice of this invention that a thermally insulative material be used to prevent upward heat transfer by conduction. The use of a plastic material has been found suitable in the practice of the invention. The baffle elements 40, 42, 46 and 48 may be attached to the equipment frame by screws and brackets or other mounting means.

As components located within the equipment frame 10 dissipate heat, the heated air from the lower sections of the equipment frame 10 rises upward as illustrated by the air flow representation arrows 36 and 50 with the replacement air entering only from the front and bottom of each of the levels thus providing the cooling air that enters the frame. The main cool air input is the front replacement air as illustrated by arrows 38 and 52 with the result that cool entering the front of the frame replaces the rising heated air with the largest replacement portion coming from the front replacement flow leaving less air input available for the rear portion of the frame. This condition produces essentially two streams of rising heated air illustrated by the flow arrows labeled 54 and 56 in FIG. 3 with the front air stream 54 moving at a slightly different rate of speed than the rear stream 56, as separated for illustration by reference line 58, due to the front of the frame having a greater amount of replacement air than the rear.

Figure 4:
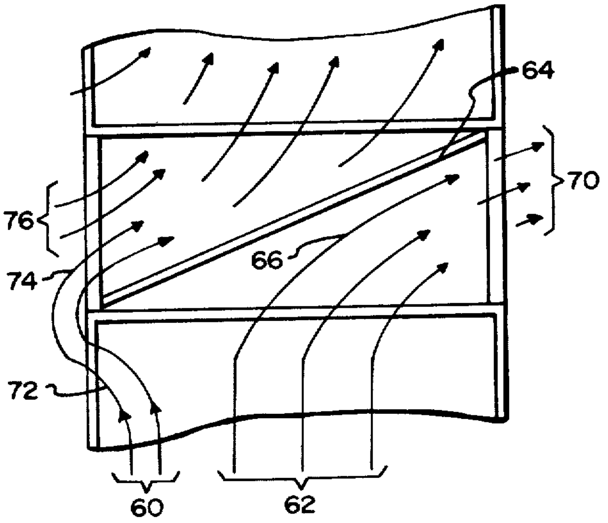
PRIOR ART FIG. 4
FIG. 4 is a side view of equipment utilizing a single baffle element as in systems of the prior art.

To illustrate the principles of the invention, a prior art apparatus is shown in FIG. 4 with a front air stream 60 and a rear air stream 62. In FIG. 4, the rear air stream 62 being of higher temperature and closer to the opening at the rear of the frame upon reaching the single baffle element 64 will deflect along the baffle as at 66 and out the rear of the frame at 70. However the front air stream 60 upon reaching the baffle element 64 will be blocked by the hot air rear stream 62. This results in the front stream 60 taking the reverse but faster direction of travel down the front of the baffle at 72 and the equipment frame and into the input of the next immediate upper section at 74. This mixing of the front air stream 60 and the front replacement air 76 of the next upper section causes a turbulence and mixing of additional heated air being transmitted to the next upper sections with a consequent increasing thermal overload of upper sections and decreased thermal efficiency.

To correct this condition, the duo-baffle air separator apparatus of the present invention as shown in FIG. 3 provides the second baffle element 42 positioned below the first baffle element 40 extending from the rear of the frame frontwardly to the point 78 where the front air stream previously reversed direction. The second baffle element 42 now deflects the rear air stream 56 out to the rear of the equipment which leaves a channel as indicated by reference arrow 80 for the front air stream 54 to pass between the baffle elements 40 and 42 and out the rear of the equipment as illustrated by flow arrows 82. The front air stream 54 now travels in this channel and escapes out the rear of the equipment and does not effect the upper section cooling and thermal efficiency.

The duo-baffle air separator apparatus of the present invention provides a simple and unique method of moving air streams and separating air streams of different speeds efficiently in a direction required to eliminate turbulence effects and thermal inefficiencies and overloads in stacked electronic equipment racks.

Whereas the preferred form of the invention has been shown and described herein, it should be realized that there may be many modifications, substitutions and alterations thereto without departing from the teachings of this invention.

Having described what is new and novel and desired to secure by letters patent, what is claimed is:

1. An air separator apparatus for use in a frame of heat dissipating equipment separated into vertical sections being of a generally open construction at the front and sides and being of generally closed construction at the rear with the vertical sections being spaced apart one from the other, said air separator apparatus comprising:

first baffle means located in the spacing between sections of the equipment, said first baffle means including a first substantially air impervious baffle being positioned at an inclined angle to the horizontal and extending from the front to the rear of the equipment frame; and second baffle means located in the spacing between sections of the equipment, said second baffle means including a second substantially air impervious baffle being positioned vertically below said first baffle and generally parallel to said first baffle, said second baffle being of a shorter dimension as measured from front to rear of the equipment relative to said first baffle, said second baffle extending from the rear of the equipment and terminating at a point before the front of the equipment frame;

said air separator apparatus being effective to thermally isolate intermediate vertical sections of the equipment by separating rising heated air streams having different flow speeds due to the front of the equipment rack having a higher volume of replacement air than the rear of the equipment, the front rising air stream passing between said first and second baffles and out the rear of said equipment, the rear air stream deflecting along the lower surface of said second baffle and out the rear of the equipment.

2. The air separator apparatus as recited in claim 1 wherein said first and second baffles are generally planar shaped.

3. The air separator apparatus as recited in claim 1 wherein said first and second baffles are of generally arcuate cross section.

4. The air separator apparatus as recited in claim 1 wherein said second baffle terminates at a point along the side of the equipment where the front air stream would reverse direction if only a single baffle were positioned in the equipment.

5. The air separator apparatus as recited in claim 2 wherein said first and second baffles are formed of a thermally insulative material.

* * * * *